United States Patent
Kim et al.

(10) Patent No.: US 8,952,356 B2
(45) Date of Patent: *Feb. 10, 2015

(54) SEMICONDUCTOR DEVICE, METHOD OF MANUFACTURING THE SAME, AND ELECTRONIC DEVICE INCLUDING THE SEMICONDUCTOR DEVICE

(75) Inventors: Sun-kook Kim, Hwaseong-si (KR); Woong Choi, Seongnam-si (KR); Yong-wan Jin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 170 days.

This patent is subject to a terminal disclaimer.

(21) Appl. No.: 13/292,285

(22) Filed: Nov. 9, 2011

(65) Prior Publication Data

US 2012/0248414 A1  Oct. 4, 2012

(30) Foreign Application Priority Data

Mar. 30, 2011  (KR) .................. 10-2011-0029035

(51) Int. Cl.
*H01L 29/06* (2006.01)
*H01L 29/16* (2006.01)
*B82Y 10/00* (2011.01)
(Continued)

(52) U.S. Cl.
CPC ............ *H01L 29/1606* (2013.01); *B82Y 10/00* (2013.01); *H01L 29/66431* (2013.01); *H01L 29/7782* (2013.01); *B82Y 30/00* (2013.01); *H01L 29/2831* (2013.01); *H01L 29/1054* (2013.01); *Y10S 977/734* (2013.01)
USPC ............. 257/29; 257/E21.409; 257/E29.242; 438/299; 977/734

(58) Field of Classification Search
USPC ........................................................ 977/938
See application file for complete search history.

(56) References Cited

U.S. PATENT DOCUMENTS

2006/0216897 A1* 9/2006 Lee et al. ................. 438/282
2007/0017439 A1* 1/2007 Xianyu et al. ............ 117/108
(Continued)

FOREIGN PATENT DOCUMENTS

JP  2009-164432 A  7/2009
JP  2009-182173 A  8/2009
(Continued)

OTHER PUBLICATIONS

Xiaolin Li, et al., "Chemically Derived, Ultrasmooth Graphene Nanoribbon Semiconductors", Science 319, pp. 1229-1232, Feb. 29, 2008.

(Continued)

*Primary Examiner* — William F Kraig
*Assistant Examiner* — Khaja Ahmad
(74) *Attorney, Agent, or Firm* — Harness, Dickey & Pierce, P.L.C.

(57) ABSTRACT

An example embodiment relates to a semiconductor device including a semiconductor element. The semiconductor element may include a plurality of unit layers spaced apart from each other in a vertical direction. Each unit layer may include a patterned graphene layer. The patterned graphene layer may be a layer patterned in a nanoscale. The patterned graphene layer may have a nanomesh or nanoribbon structure. The semiconductor device may be a transistor or a diode. An example embodiment relates to a method of making a semiconductor device including a semiconductor element.

21 Claims, 17 Drawing Sheets

(51) Int. Cl.
*H01L 29/66* (2006.01)
*H01L 29/778* (2006.01)
*B82Y 30/00* (2011.01)
*H01L 29/10* (2006.01)

(56) References Cited

U.S. PATENT DOCUMENTS

| | | | |
|---|---|---|---|
| 2009/0201743 A1* | 8/2009 | Yang | 365/185.28 |
| 2010/0214012 A1 | 8/2010 | Raza | |
| 2010/0258787 A1 | 10/2010 | Chae et al. | |
| 2011/0062417 A1* | 3/2011 | Iwayama et al. | 257/24 |
| 2011/0253980 A1* | 10/2011 | Chang et al. | 257/24 |
| 2012/0032149 A1* | 2/2012 | Chen et al. | 257/24 |
| 2012/0085991 A1* | 4/2012 | Cohen et al. | 257/28 |
| 2012/0301953 A1* | 11/2012 | Duan et al. | 435/287.9 |

FOREIGN PATENT DOCUMENTS

| | | |
|---|---|---|
| JP | 2009-277803 A | 11/2009 |
| KR | 20100111999 A | 10/2010 |

OTHER PUBLICATIONS

Jingwei Bai, et al., "Graphene nanomesh", Nature Nanotechnology, Letters, Feb. 14, 2010, pp. 190-194.

* cited by examiner

SEMICONDUCTOR DEVICE, METHOD OF MANUFACTURING THE SAME, AND ELECTRONIC DEVICE INCLUDING THE SEMICONDUCTOR DEVICE

CROSS-REFERENCE TO RELATED APPLICATIONS

This application claims priority under 35 U.S.C. §119 to the benefit of Korean Patent Application No. 10-2011-0029035, filed on Mar. 30, 2011, in the Korean Intellectual Property Office, the disclosure of which is incorporated herein in its entirety by reference.

BACKGROUND

1. Field

Some example embodiments relate to semiconductor devices, methods of manufacturing the same, and/or electronic devices including the semiconductor devices.

2. Description of the Related Art

Semiconductor devices, such as a transistor and a diode, are widely used for various purposes in various electronic device fields. For example, a transistor may be used as a switching device or a driving device in a display, a memory device and a logic circuit field, or as a basic element of various circuits.

Most transistors that are currently commercialized are silicon (Si)-based metal oxide semiconductor field effect transistors (MOS-FETs). However, due to the limitations of characteristics and manufacturing processes of the Si-based MOS-FETs, next-generation materials and devices are being studied and developed. For example, there have been attempts to apply a nanostructure, such as graphene or carbon nanotube (CNT), to a semiconductor device. However, when the semiconductor device is manufactured by using the nanostructure, such as graphene or CNT, it is difficult to control characteristics of the nanostructure, and there may be a large device-to-device variation.

SUMMARY

Some example embodiments relate to semiconductor devices that may obtain good uniformity in characteristics and have good operation characteristics.

Some example embodiments relate to electronic devices including the semiconductor devices.

Some example embodiments relate to methods of manufacturing the semiconductor devices.

Additional aspects will be set forth in part in the description which follows and, in part, will be apparent from the description, or may be learned by practice of example embodiments.

According to an example embodiment, a semiconductor device includes a semiconductor element that includes a plurality of unit layers. The plurality of unit layers are spaced apart from each other in a vertical direction. Each of the plurality of unit layers includes a patterned graphene layer.

The patterned graphene layer may include a nanoscale pattern.

The patterned graphene layer may include a nanomesh structure.

The patterned graphene layer may include a nanoribbon structure.

A width of a pattern of the patterned graphene layer may be in the range from about 2 nm to about 10 nm.

The semiconductor device may further include an insulation layer between every two adjacent unit layers.

The semiconductor device may be a transistor and the semiconductor element may be a channel layer.

The transistor may have a single-gate or double-gate structure.

The semiconductor device may be a diode. The diode may include a first layer combined with a second layer. The first layer may include the semiconductor element.

The second layer may be a semiconductor layer.

The second layer may be a metal layer.

According to another example embodiment, an electronic device includes the semiconductor device.

The electronic device may be one of a display device and a photoelectronic device.

The semiconductor device may be included in one of a switching device, a driving device, and a sensing device.

According to another example embodiment, a method of manufacturing a semiconductor device includes forming a semiconductor element by forming a plurality of unit layers. The plurality of unit layers may be spaced apart from each other in a vertical direction. Each of the plurality of unit layers may include a patterned graphene layer.

The forming of the semiconductor element may include: forming a first patterned graphene layer on a first substrate; transferring the first patterned graphene layer from the first substrate to a second substrate; forming a first insulation layer on the first patterned graphene layer; and forming a second patterned graphene layer on the first insulation layer.

The second patterned graphene layer may be prepared on a third substrate and transferred on the first insulation layer after being prepared on a third substrate.

The method may further include forming a second insulation layer on the second patterned graphene layer, and forming a third patterned graphene layer on the second insulation layer.

The second substrate may be a flexible substrate.

The forming of the semiconductor element may include: forming a first patterned graphene layer on a first substrate; forming a first insulation layer on the first patterned graphene layer; and forming a second patterned graphene layer on the first insulation layer.

The method may further include forming a second insulation layer on the second patterned graphene layer, and forming a third patterned graphene layer on the second insulation layer.

The patterned graphene layer may include a nanoscale pattern.

The patterned graphene layer may include one of a nanomesh and nanoribbon structure.

A width of a pattern of the patterned graphene layer may be in the range from about 2 to about 10 nm.

The semiconductor device may be a transistor. The method may further include: forming a source contacting a first region of the semiconductor element, forming a drain contacting a second region of the semiconductor element, and forming a gate configured to apply an electric field to the semiconductor element.

The semiconductor device may be a diode. The semiconductor element may be a first layer, and the method may further include forming a second layer contacting the semiconductor element. The second layer may be one of a semiconductor layer and a metal layer.

BRIEF DESCRIPTION OF THE DRAWINGS

These and/or other aspects will become apparent and more readily appreciated from the following description of non-limiting example embodiments, as illustrated in the accompanying drawings, in which like reference characters refer to the same parts throughout the different views. The drawings are not necessarily to scale, emphasis instead being placed upon illustrating the principles of example embodiments. In the drawings.

DETAILED DESCRIPTION

Figure 1:
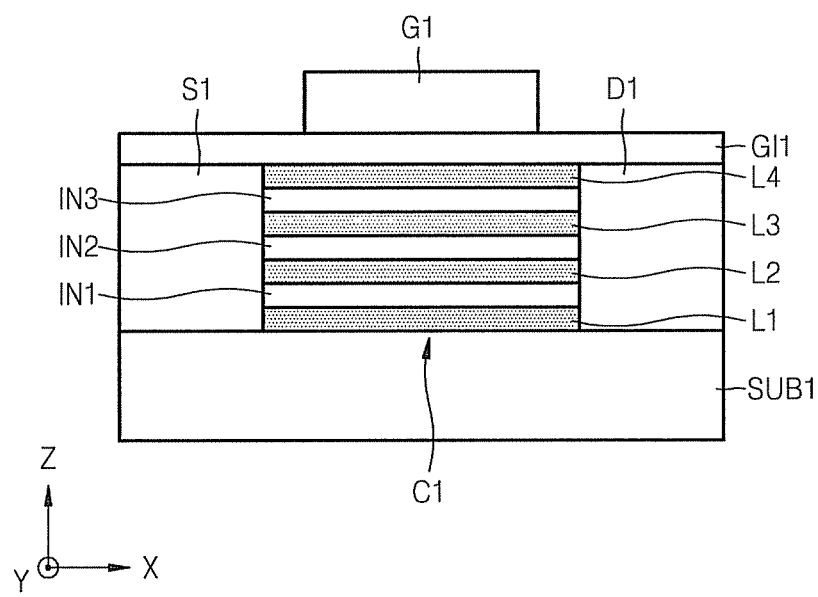
FIG. 1 a cross-sectional view of a transistor according to an example embodiment.

Various example embodiments will now be described more fully with reference to the accompanying drawings in which example embodiments are shown. Example embodiments, may, however, be embodied in many different forms and should not be construed as being limited to the embodiments set forth herein; rather, these example embodiments are provided so that this disclosure will be thorough and complete, and will fully convey concepts of example embodiments to those of ordinary skill in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, semiconductor devices, methods of manufacturing the same, and electronic devices including the semiconductor devices will be described in detail with reference to accompanying drawings. In the drawings, like reference numerals denote like elements, and thus duplicative descriptions will be omitted. The width and thicknesses of layers and regions are exaggerated for clarity.

FIG. 1 a cross-sectional view of a transistor (semiconductor device) according to an example embodiment.

Referring to FIG. 1, a semiconductor element used as a channel layer C1 may be disposed on a desired (or alternatively predetermined) substrate SUB1. The substrate SUB1 may be a glass substrate or any one of various substrates used in a general semiconductor device manufacturing process, such as a plastic substrate and a silicon substrate. The substrate SUB1 may be a flexible or rigid substrate, and may be transparent or opaque. The channel layer C1 may include a plurality of unit layers L1 through L4 spaced apart from each other in a vertical direction, i.e., in a Z-axis direction. The number of unit layers is not limited to four, and may vary. Each of the unit layers L1 through L4 may include a patterned graphene layer. Structures of the unit layers L1 through L4 will be described in detail with reference to FIGS. 2 through 4. Insulation layers IN1 through IN3 may be between the unit layers L1 and L2, between the unit layers L2 and L3, and between the unit layers L3 and L4. The insulation layers IN1 through IN3 may operate as barriers for each of the unit layers L1 through L4 to maintain their electric characteristics. The insulation layers IN1 through IN3 may be formed of an inorganic insulation material, such as at least one of a silicon oxide, a silicon nitride, and an aluminum oxide, or an organic insulation material.

A source electrode S1 and a drain electrode D1, respectively contacting ends (or sides) of the channel layer C1, may be included in the transistor. The source and drain electrodes S1 and D1 may be formed of any metal used in a general semiconductor device manufacturing process to form an electrode, or may be formed of a transparent conductive oxide (TCO), such as an indium tin oxide (ITO) or an indium zinc oxide (IZO). Alternatively, the source and drain electrodes S1 and D1 may be formed of graphene. The source and drain electrodes S1 and D1 may have a single or multi-layer structure. The unit layers L1 through L4 may be connected in parallel between the source and drain electrodes S1 and D1. One end of the unit layers L1 through L4 may be connected to the source electrode S1 and other end of the unit layers L1 through L4 may be connected to the drain electrode D1.

A gate G1 for controlling electric characteristics of the channel layer C1 may be further provided. The electric characteristics of the channel layer C1 may be controlled by an electric field applied from the gate G1 to the channel layer C1. The gate G1 may be disposed, for example, above the channel layer C1. Like the source and drain electrodes S1 and D1, the gate G1 may be formed of one of various metals, a transparent conductive oxide, or another material, such as graphene. The gate G1 may be the same material layer as or a different material layer from the source and drain electrodes S1 and D1.

A gate insulation layer GI1 may be between the channel layer C1 and the gate G1. The gate insulation layer GI1 may include a silicon oxide, a silicon oxynitride, a silicon nitride, or another material, such as an organic insulation material or a high dielectric material having a dielectric constant higher than that of the silicon nitride. The gate insulation layer GI1 may have a single or multi-layer structure.

Figure 2:
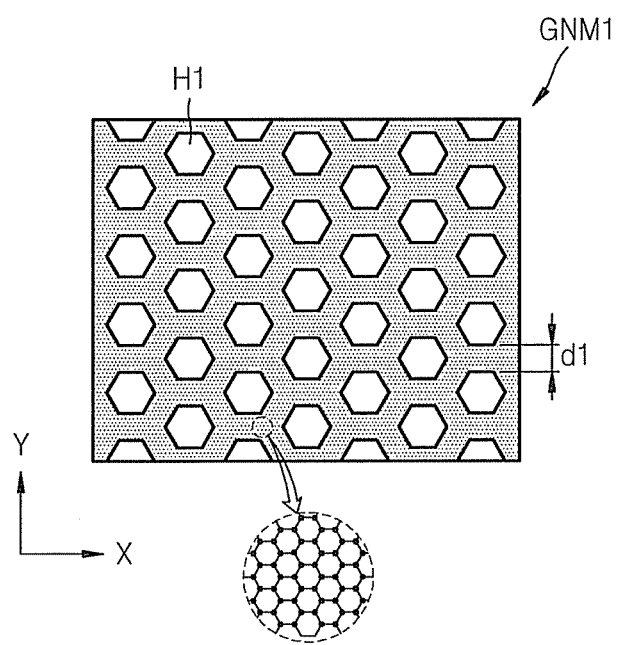
FIGS. 2 through 4 are plan views of a patterned graphene layer (channel layer) in the transistor of FIG. 1.
Figure 3:
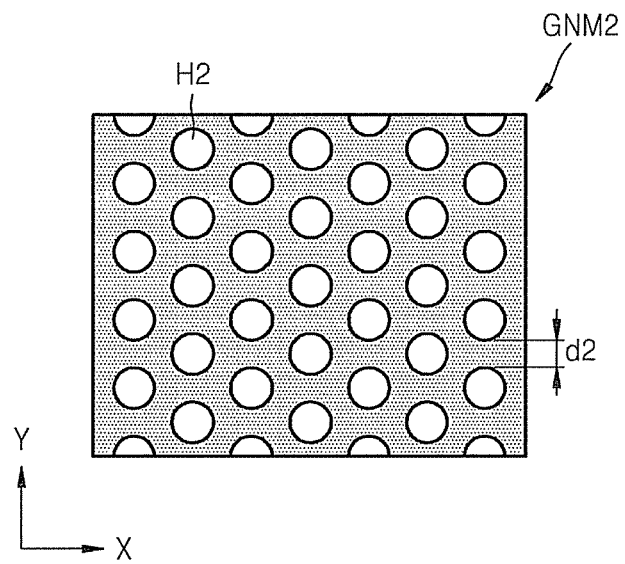
Figure 4:
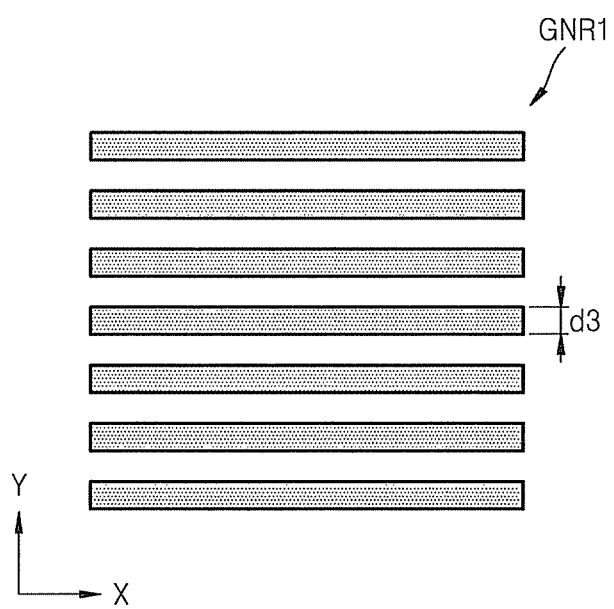

Each of the unit layers L1 through L4 of FIG. 1 may include a patterned graphene layer. The patterned graphene layer may include a nanoscale pattern. FIGS. 2 through 4 are plane views showing various layer structures of the unit layers L1 through L4 of FIG. 1. FIGS. 2 and 3 respectively show graphene layers GNM1 and GNM2 having a nanomesh structure, and FIG. 4 shows a graphene layer GNR1 having a nanoribbon structure.

Referring to FIG. 2, the graphene layer GNM1 having the nanomesh structure (hereinafter, referred to as a graphene nanomesh GNM1) may be a graphene layer in which a plurality of nanoholes H1 are regularly formed. The nanoholes H1 may have a hexagonal shape or a polygonal shape similar to a hexagonal shape. A width d1 of a pattern of the graphene nanomesh GNM1, i.e., an interval between adjacent two nanoholes H1, may be from about 2 nm to about 10 nm. Meanwhile, a partial magnified view of FIG. 2 shows a crystalline structure of graphene. As shown in the partial magnified view, the graphene may have a hexagonal structure formed of carbon atoms.

The structure of the graphene nanomesh GNM1 of FIG. 2 may be modified to that of FIG. 3. A nanohole H2 of the graphene nanomesh GNM2 of FIG. 3 may have a circular shape or a shape similar to a circular shape. Like FIG. 2, a width d2 of a pattern of the graphene nanomesh GNM2 may be from about 2 nm to about 10 nm.

Referring to FIG. 4, the graphene layer GNR1 having the nanoribbon structure (hereinafter, referred to as graphene nanoribbon GNR1) may be a graphene layer having a stripe pattern. A width d3 of a pattern of the graphene nanoribbon GNR1 may be from about 2 nm to about 10 nm. An interval between patterns of the graphene nanoribbon GNR1 may be in a nanoscale.

The graphene nanomeshes GNM1 and GNM2 of FIGS. 2 and 3, and the graphene nanoribbon GNR1 of FIG. 4 may each be a layer patterned from one graphene, or a layer patterned from layers of stacked graphenes, for example, 2 to 10 graphenes.

The patterned graphene layer, such as the graphene nanomeshes GNM1 and GNM2 of FIGS. 2 and 3, and the graphene nanoribbon GNR1 of FIG. 4 may have electric characteristics suitable for a semiconductor device, which will be described in detail with reference to FIGS. 5 and 6.

Figure 5:
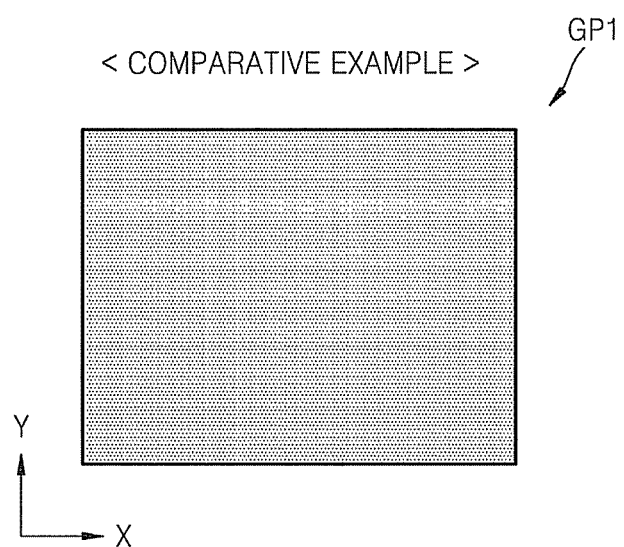
FIG. 5 is a plan view of a graphene layer according to a comparative example.

FIG. 5 is a plan view of a graphene layer GP1 having a sheet structure according to a comparative example, which is compared to a patterned graphene layer according to an example embodiment.

Referring to FIG. 5, the graphene layer GP1 having the sheet structure may be a layer formed of one or more graphenes. For example, the graphene layer GP1 may include about 1 to about 10 layers of graphenes. Since the graphene layer GP1 generally has electric characteristics similar to a metallic material with a zero bandgap, an on/off current ratio of a transistor using the graphene layer GP1 as a channel layer may be very low, for example 10 or lower. Also, properties of the graphene layer GP1 may not be uniform because the graphene layer GP1 may include a plurality of grains having different atom arrangement characteristics. Thus, if a semiconductor device includes a graphene layer GP1 having the sheet structure as shown in FIG. 5 as a semiconductor element, obtaining excellent operation characteristics, good uniformity, and good reproducibility may be difficult.

Figure 6:
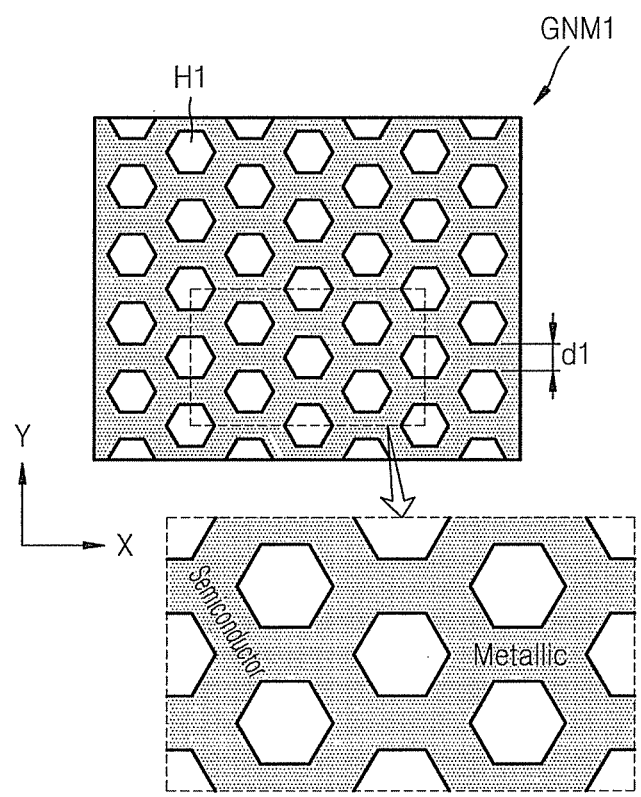
FIG. 6 is a plan view of a patterned graphene layer (channel layer) in a transistor according to an example embodiment, wherein the patterned graphene layer is patterned from the graphene layer of FIG. 5.

However, when a graphene nanomesh GNM1 of FIG. 6 is formed by patterning the graphene layer GP1 of FIG. 5, low operation characteristics, low uniformity, and low reproducibility may be prevented and/or reduced, thereby improving characteristics of a semiconductor device and obtaining uniformity and reproducibility. In detail, when the graphene layer GP1 is patterned to obtain the graphene nanomesh GNM1 of FIG. 6, a bandgap widens, and thus semiconductor characteristics may improve. The graphene nanomesh GNM1 may have a structure in which a semiconductor region and a metallic region are mixed. In other words, as shown in a partial magnified view of FIG. 6, regions of the graphene nanomesh GNM1 may have semiconductor characteristics, and other regions may have metallic characteristics. Electric characteristics of the desired (or alternatively predetermined) regions may be related to an edge structure of the desired (or alternatively predetermined) regions. The electric characteristics may differ based on whether the edges of the desired (or alternatively predetermined) regions have a zigzag structure or armchair structure. As such, the graphene nanomesh GNM1 may have the structure in which the semiconductor region and the metallic region are mixed, but since the metallic regions have discontinuous structure, the graphene nanomesh GNM1 may show semiconductor characteristics. Accordingly, an on/off current ratio of a transistor using the graphene nanomesh GNM1 as a channel layer may be increased up to about $10^3$ or above. Also, since a bandgap may be adjusted by adjusting a width d1 of a pattern of the graphene nanomesh GNM1, characteristics of the semiconductor device may be controlled. As the width d1 decreases, the bandgap may increase. Considering a size of a bandgap of a semiconductor layer suitable to a semiconductor device, the width d1 may be in the range from about 2 nm to about 10 nm. In addition, uniformity may be improved if the graphene nanomesh GNM1 of FIG. 6 is formed by patterning the graphene layer GP1 of FIG. 5. In other words, characteristic deviation inside and between layers of the graphene nanomesh GNM1 of FIG. 6 may be lower than characteristic deviation inside and between layers of the graphene layer GP1 of FIG. 5. Accordingly, when a patterned graphene layer, for example the graphene nanomesh GNM1 of FIG. 6, is applied as the unit layers L1 through L4 of FIG. 1, an on/off current ratio of a transistor may be increased, and uniformity and reproducibility may be improved. Such effects may be obtained by using the graphene nanomesh GNM2 of FIG. 3 or the graphene nanoribbon GNR1 of FIG. 4.

Figure 7:
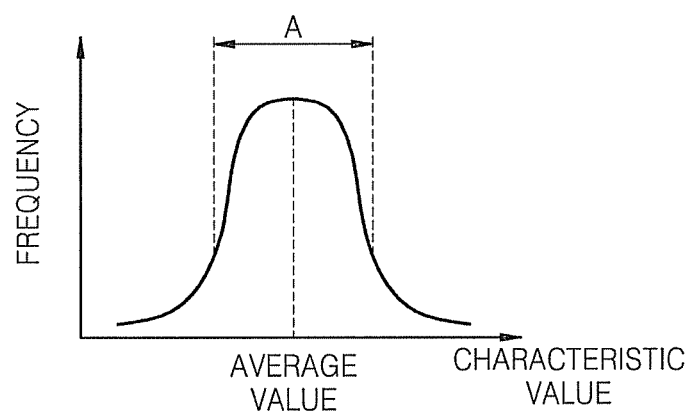
FIG. 7 is a graph of the characteristic distribution of unit layers (graphene layers) used in a transistor, according to an example embodiment.

Furthermore, as shown in FIG. 1, when the unit layers L1 through L4 are spaced apart form each other in the vertical direction, higher uniformity may be obtained and the operation characteristics of the semiconductor device may be further improved. In detail, when the unit layers L1 through L4 are spaced apart from each other in the vertical direction, electric characteristics of the unit layers L1 through L4 may approach an average value, and thus, the uniformity and the operation characteristics of the semiconductor device may be improved. Although characteristics of the unit layers L1 through L4 may be somewhat uniform, there still may be deviation. The characteristics of the unit layers L1 through L4 may have a distribution shown in FIG. 7 which is similar to a normal distribution. For example, about 90% of the unit layers L1 through L4 may have normal values corresponding to a region A, and the remaining 10% may have values deviating from the region A. However, as the number of stacked unit layers L1 through L4 increases, the characteristics of the unit layers L1 through L4 may approach a statistical average value. In other words, as the stacked number of unit layers L1 through L4 increases, the characteristics of the unit layers L1 through L4 may approach the normal values in the region A. Thus, according to an example embodiment, device-to-device variations may be reduced (and/or prevented), and a semiconductor device having more uniform electric characteristics may be realized.

Also, when the transistor of FIG. 1 uses a patterned graphene layer (the graphene nanomesh GNM1 or GNM2 FIG. 2 or 3, or the graphene nanoribbon GNR1 of FIG. 4) as a channel element, mobility of the transistor may be about 10 times faster than that of a general transistor. The faster mobility may be due to intrinsic electric characteristics of graphene, such as 2-dimensional ballistic transport characteristics. The fact that charges move 2-dimensionally and ballistically in a material means that the charges are moving without resistance due to scattering. Accordingly, mobility of charges in graphene may be very high. Therefore, when the transistor of FIG. 1 is used, a high performance electric device, such as a display device or a photoelectronic device, may be realized.

Further, the transistor of FIG. 1 may have a transparent characteristic overall. The patterned graphene layer (the graphene nanomesh GNM1 or GNM2 of FIG. 2 or 3, or the graphene nanoribbon GNR1 of FIG. 4) used in the channel layer C1 may be transparent due to very thin thickness. Materials for forming the source and drain electrodes S1 and D1 and the gate G1 may also be a transparent material, such as a transparent conductive oxide or graphene. Accordingly, the transistor may be transparent overall. For example, the transistor according to an example embodiment may have light transmittance equal to or more than about 80%. Also, when the substrate SUB1 of FIG. 1 is flexible, the transistor may also be flexible. The patterned graphene layer (the graphene nanomesh GNM1 or GNM2 of FIG. 2 or 3, or the graphene nanoribbon GNR1 of FIG. 4) of the channel layer C1 may be flexible, and the source and drain electrodes S1 and D1 and the gate G1 may also be flexible. Accordingly, the transistor of FIG. 1 may be flexible. For example, the transistor according to an embodiment may have flexible elongation equal to or more than about 30%. However, the transistor according to an example embodiment does not have to be flexible or transparent. In other words, the transistor according to an example embodiment may be neither flexible nor transparent.

Figure 8:
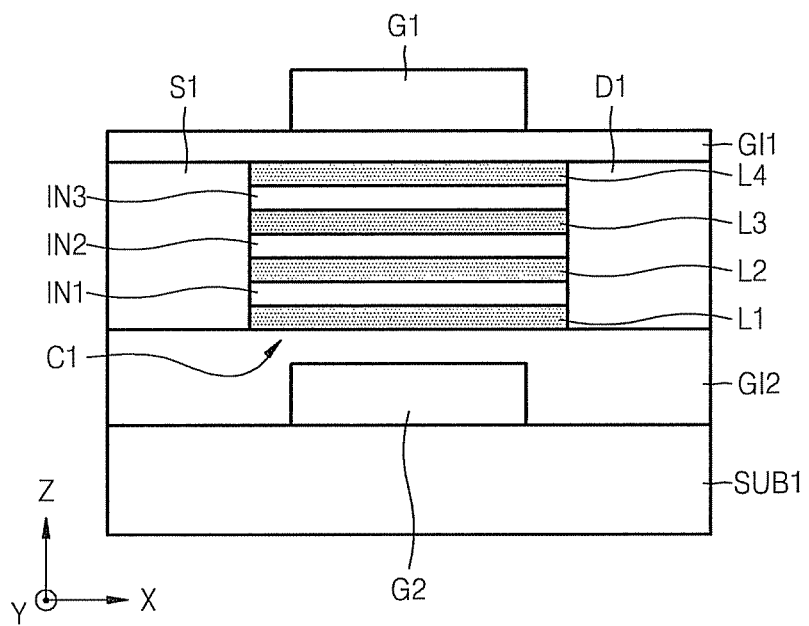
FIG. 8 is a cross-sectional view of a transistor according to another example embodiment.

FIG. 8 is a cross-sectional view of a transistor (semiconductor device) according to another example embodiment. The transistor of FIG. 8 is modified from the transistor of FIG. 1, and another gate G2 (hereinafter, referred to as a second gate G2) is below a channel layer C1 in FIG. 8.

Referring to FIG. 8, the second gate G2 may be on a substrate SUB1, and a second gate insulation layer GI2 may cover the second gate G2. The channel layer C1, a source electrode S1, a drain electrode D1, a first gate insulation layer GI1, and a first gate G1 may be disposed on the second gate insulation layer GI2. The channel layer C1, the source electrode S1, the drain electrode D1, the first gate insulation layer GI1, and the first gate G1 of FIG. 8 may respectively be the same as (or substantially the same as) the channel layer C1, the source electrode S1, the drain electrode D1, the gate insulation layer GI1, and the gate G1 of FIG. 1.

When the first and second gates G1 and G2 are respectively disposed on sides (top and bottom) of the channel layer C1, as shown in FIG. 8, gating characteristics may be improved since electric characteristics of the channel layer C1 may be controlled by the first and second gates G1 and G2.

A transistor according to an example embodiment may be applied to various electronic devices. For example the transistor may be used as a switching device or a driving device in a display, such as a liquid crystal display device or an organic light-emitting display device. Alternatively, the transistor may be used as a touch sensor (a type of sensing device) of a display device. As described above, since the transistor has excellent uniformity and operation characteristics, when the transistor is applied to the display, the display may have high reliability, operation characteristics, and performance. Specifically, since the transistor may be transparent, the display including the transistor may have an improved aperture ratio. Since a general Si thin film-based transistor has very low light transmittance, less than or equal to about 10%, the general Si thin film-based transistor blocks light incident from a light source (backlight or the like) of a display, thereby decreasing an aperture ratio of the display. However, since the transistor according to an example embodiment may have light transmittance equal to or more than about 80%, the transistor including the transistor has an improved aperture ratio, luminance, and energy efficiency. Also, since the transistor may be a flexible transistor having flexible elongation equal to or more than about 30%, a flexible display may be realized by using the transistor. Since a structure of the liquid crystal display device or organic light-emitting display device is known, details thereof will be omitted herein.

Alternatively, the transistor according to an example embodiment may be applied to a photoelectronic device. For example, the transistor may be applied to a photo detector or a photo sensor. Specifically, since a bandgap of a patterned graphene layer may change according to a width of a pattern, a wavelength of a light to be detected or sensed may be easily controlled. In this regard, the transistor may be applied to a photo detector or a photo sensor reacting to infrared (IR) and/or ultraviolet (UV) rays. In addition, the transistor may be applied to other electronic devices, such as a memory device, a radio frequency (RF) device, and a logic device for various purposes.

Figure 9A:
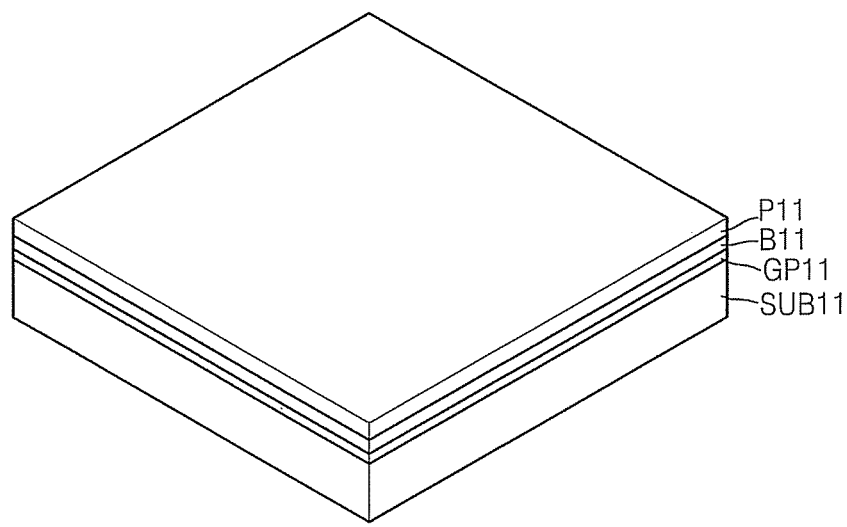
FIGS. 9A through 9Q are views for describing a method of manufacturing a transistor, according to an example embodiment.
Figure 9B:
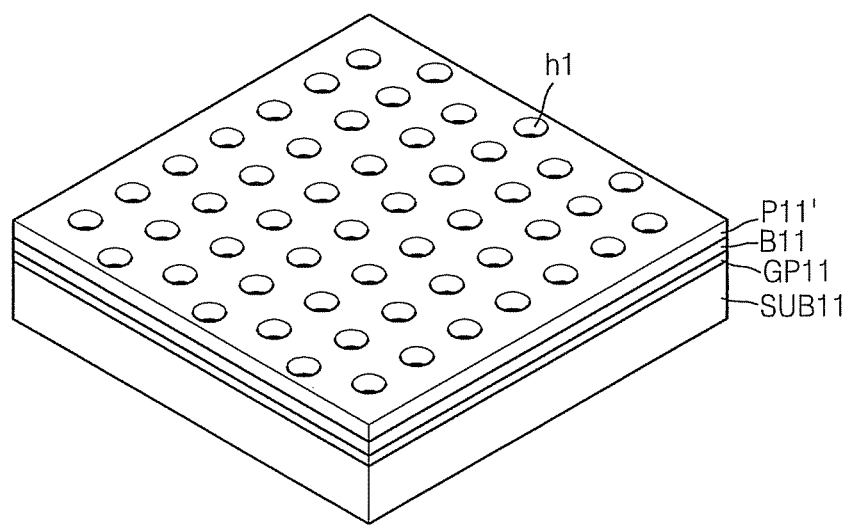
Figure 9C:
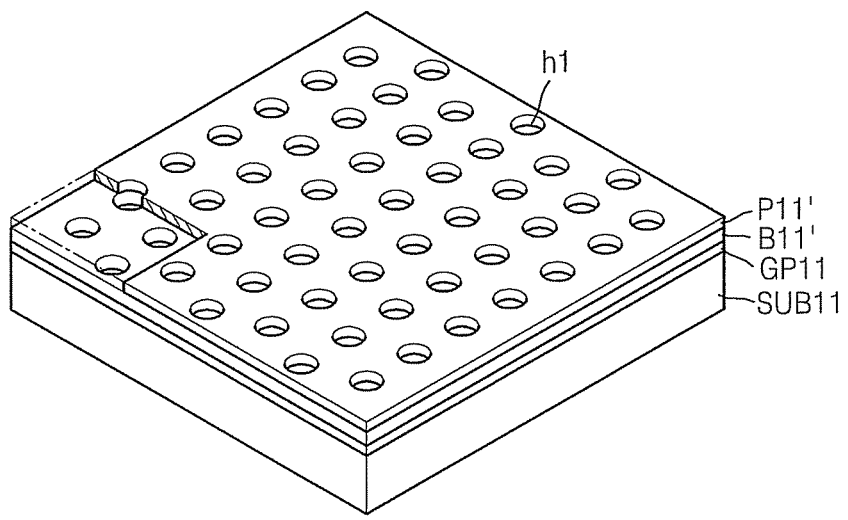
Figure 9D:
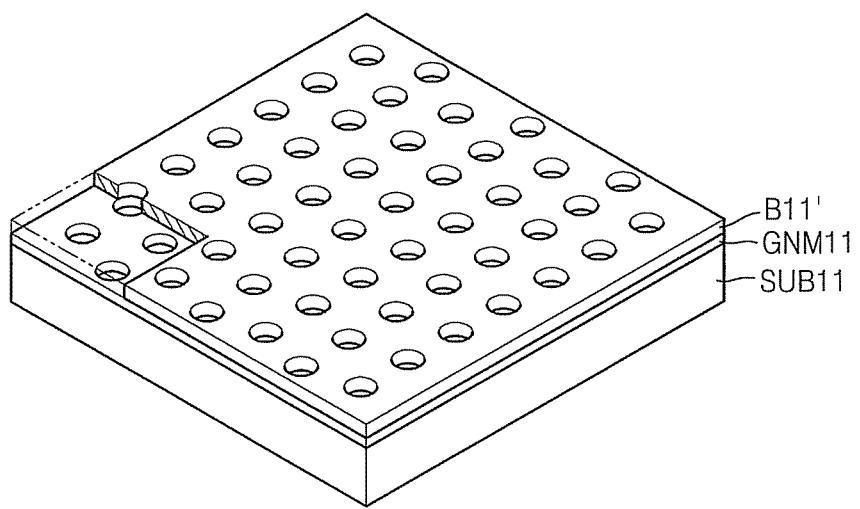
Figure 9E:
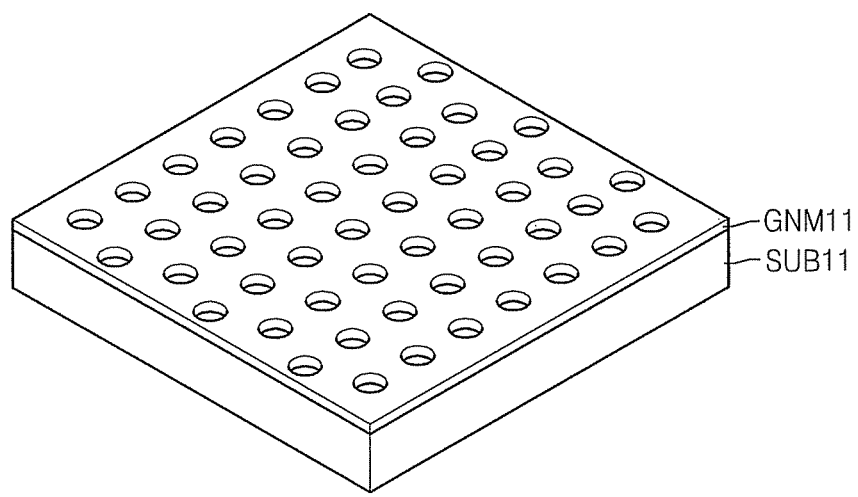
Figure 9F:
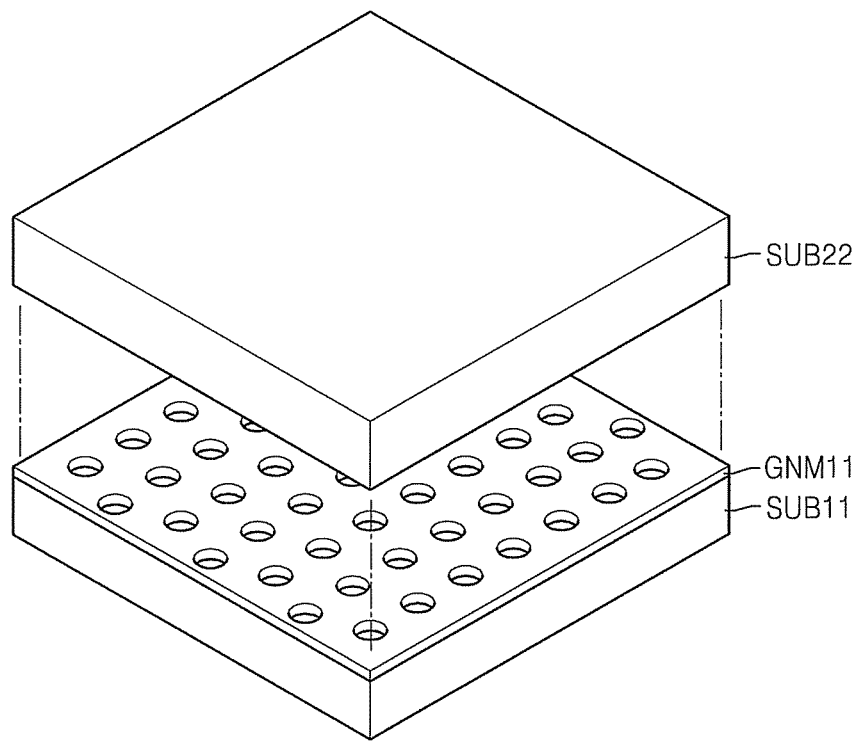
Figure 9G:
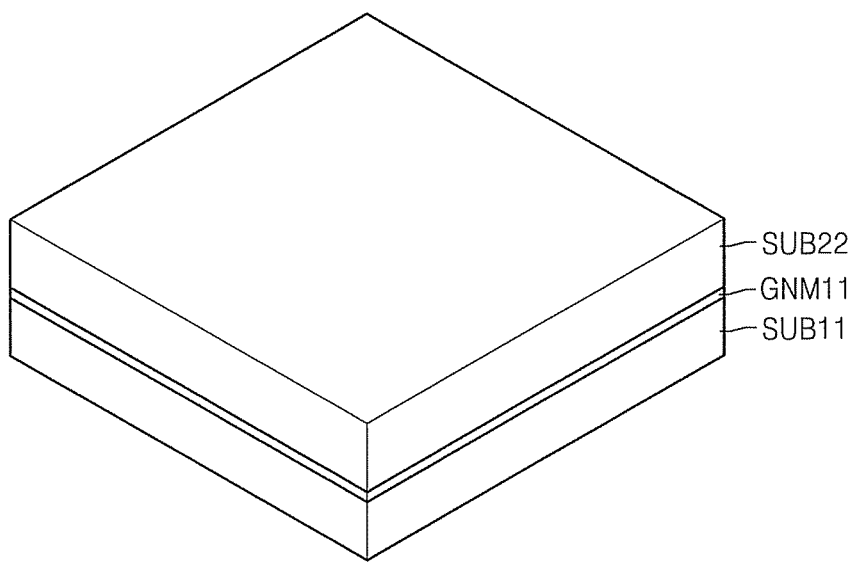
Figure 9H:
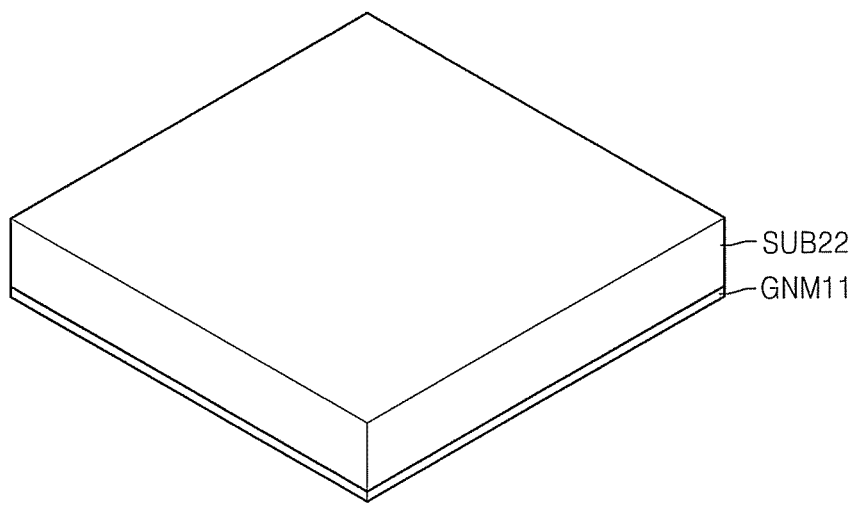
Figure 9I:
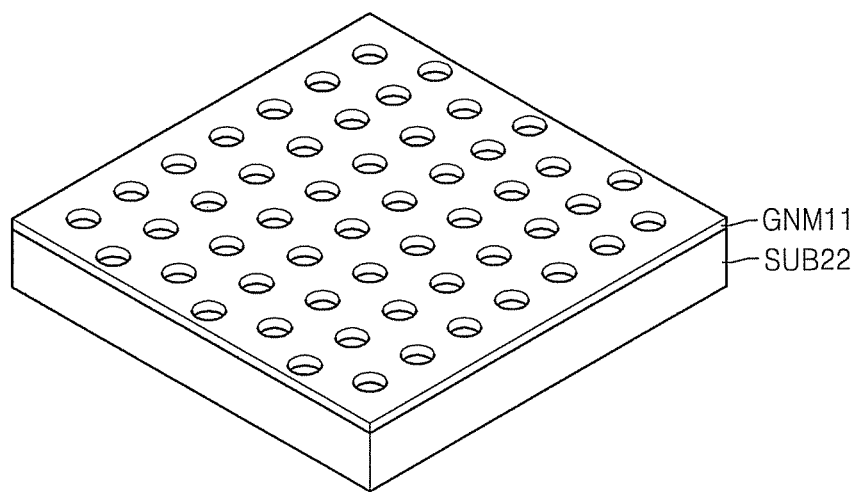
Figure 9J:
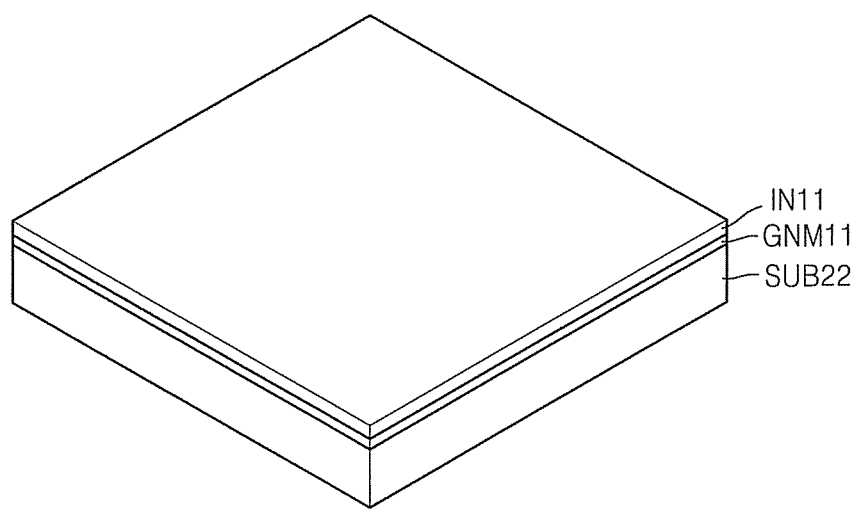
Figure 9K:
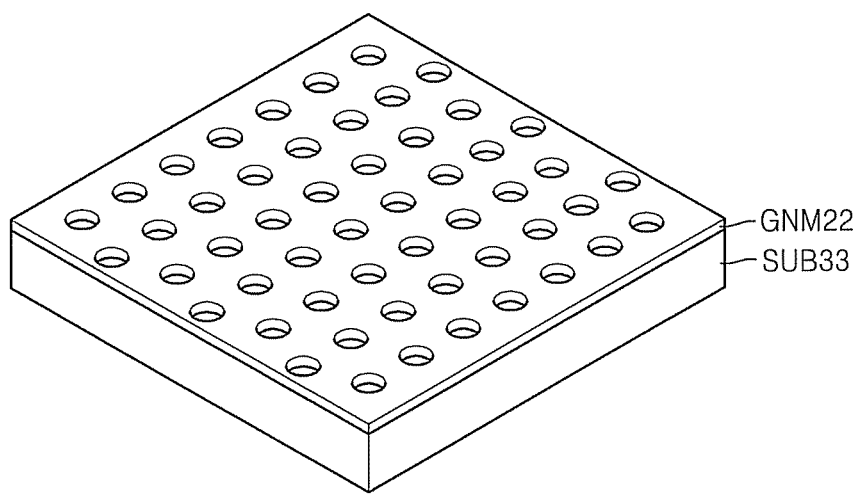
Figure 9L:
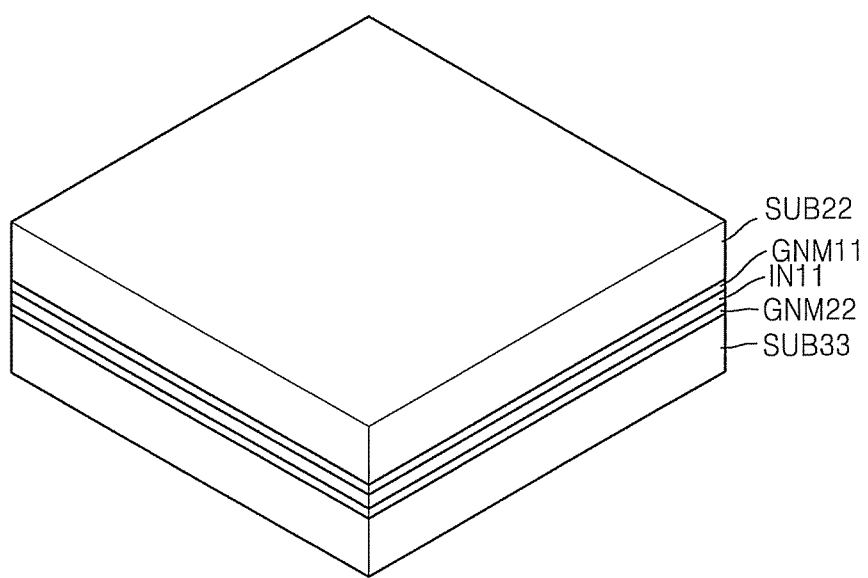
Figure 9M:
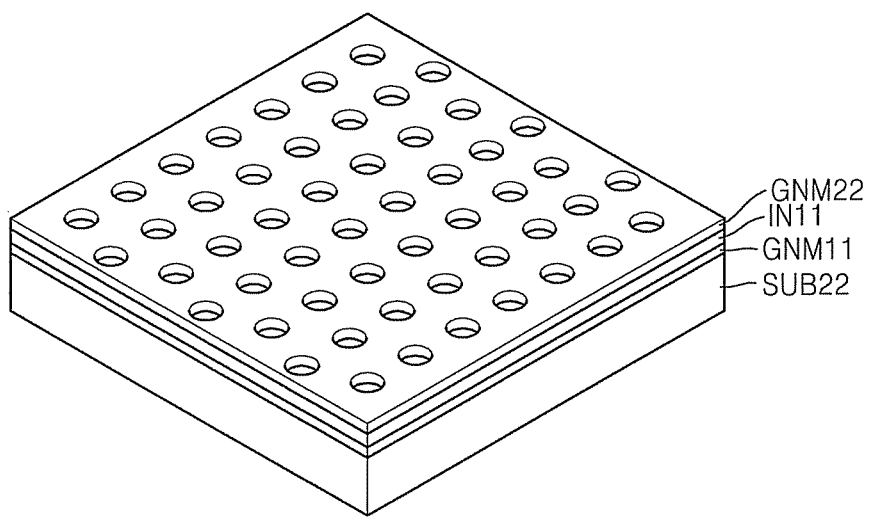
Figure 9N:
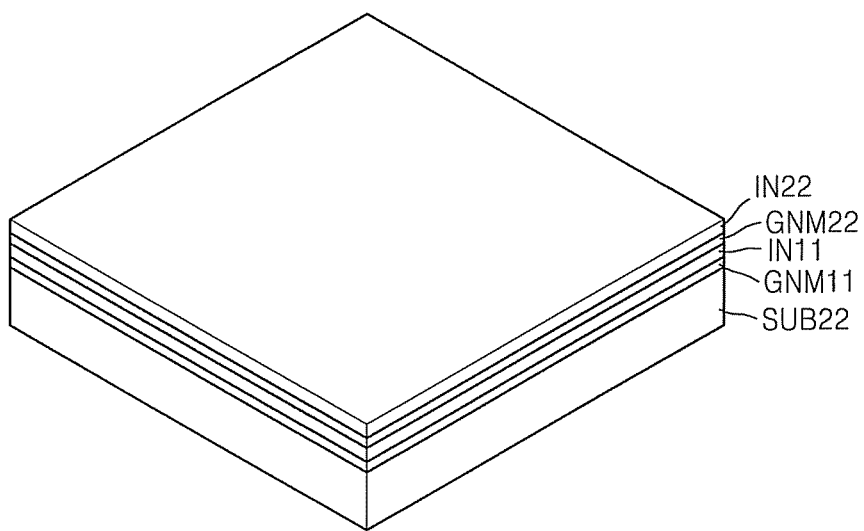
Figure 9O:
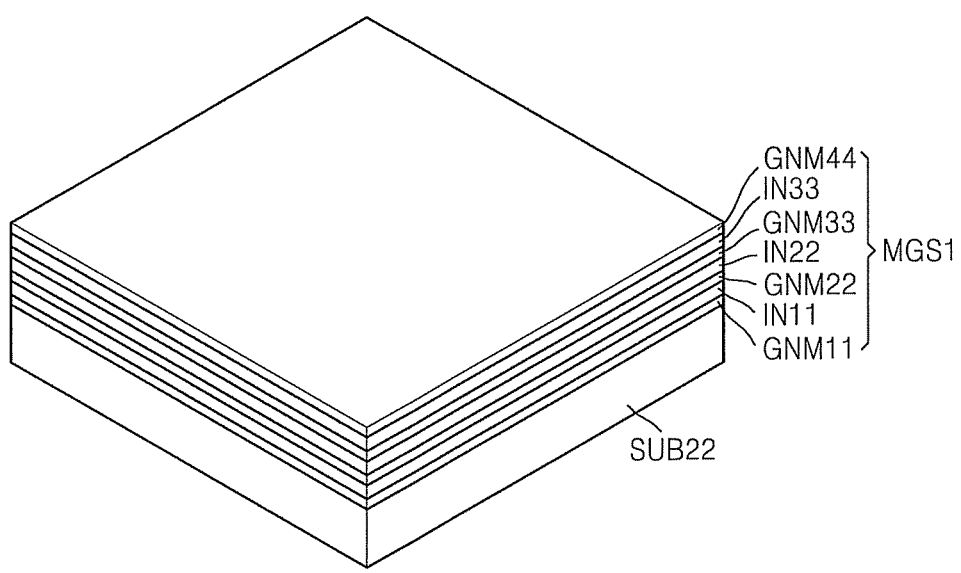
Figure 9P:
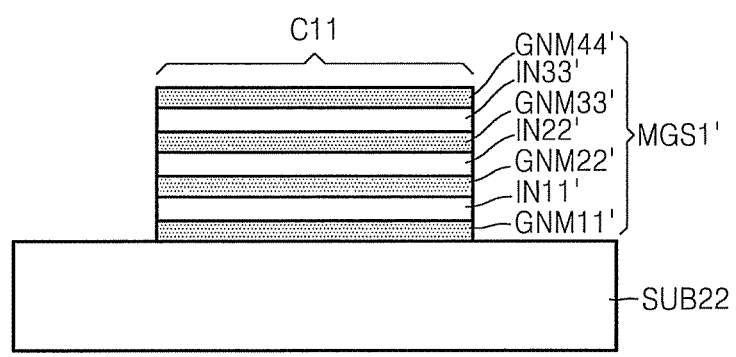
Figure 9Q:
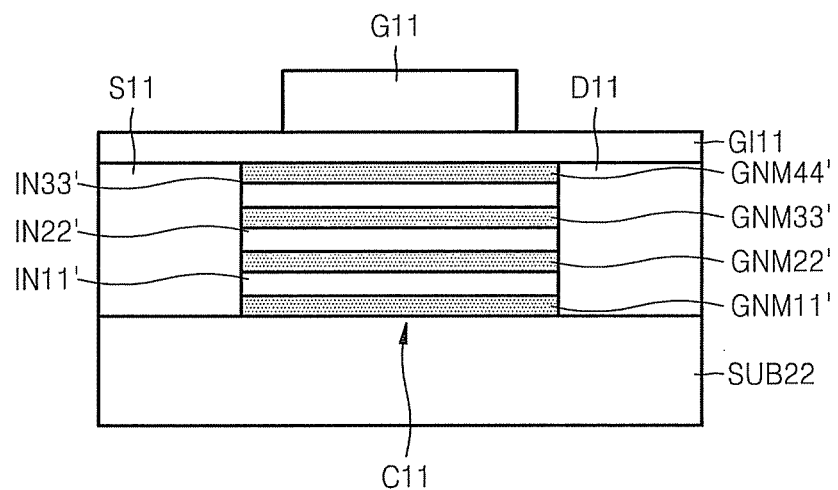

FIGS. 9A through 9Q are views for describing a method of manufacturing a transistor (semiconductor device), according to an example embodiment. FIGS. 9A through 9O are perspective views and FIGS. 9P and 9Q are cross-sectional views.

Referring to FIG. 9A, a first graphene layer GP11 may be formed on a first substrate SUB11. The first graphene layer GP11 may be a layer including one or more graphenes. For example, the first graphene layer GP11 may include about 1 to about 10 layers of graphenes. The first graphene layer GP11 may be formed (grown) by using various methods. For example, the first graphene layer GP11 may be directly grown on the first substrate SUB11 via a chemical vapor deposition (CVD) method. If the first graphene layer GP11 is grown via the CVD method, a high temperature process may be required. Accordingly, the first substrate SUB11 may be formed of a material that can endure the high temperature process. However, the method of forming the first graphene layer GP11 is not limited to CVD, and may vary.

Next, a buffer layer B11 may be formed on the first graphene layer GP11. The buffer layer B11 may be formed of an insulator, such as a silicon oxide. However, the buffer layer B11 formed of a silicon oxide is only an example, and the buffer layer B11 may be formed of another material. A polymer layer P11 may be formed on the buffer layer B11. Here, the polymer layer P11 may be a block copolymer layer. Molecules of the polymer layer P11 may have a self-assembly characteristic under a desired (or alternatively predetermined) condition.

The polymer layer P11 may be annealed so that the molecules of the polymer layer P11 self-assemble, thereby obtaining the polymer layer P11' patterned as shown in FIG. 9B. The polymer layer P11' of FIG. 9B may have a structure the same as (or similar) to the patterned graphene layer, i.e., the graphene nanomesh GNM2 of FIG. 3. A pattern shape of the polymer layer P11' of FIG. 9B may differ according to a material, composition, concentration, and an annealing condition of the polymer layer P11 of FIG. 9A. Accordingly, the polymer layer P11' of FIG. 9B may have a structure identical to the graphene nanomesh GNM1 of FIG. 2 or the graphene nanoribbon GNP1 of FIG. 4. In FIG. 9B, the buffer layer B11 below the polymer layer P11' is exposed by a hole h1 of the polymer layer P11', but sometimes, the buffer layer B11 may not be exposed as only a partial top portion of the polymer layer P11' is patterned.

Referring to FIG. 9C, the buffer layer B11 below the polymer layer P11' may be etched (patterned) by using the polymer layer P11' as an etch mask. A reactive ion etching (RIE) method may be used to etch (pattern) the buffer layer B11', for example. While etching (patterning) the buffer layer B11', a top portion of the polymer layer P11' of FIG. 9B may also be etched and removed. The buffer layer B11' patterned as such may operate as a 'hard mask' for etching (patterning) the first graphene layer GP11 below the buffer layer B11'.

As shown in FIG. 9D, the first graphene layer GP11 may be etched (patterned) by using the patterned buffer layer B11' as an etch mask (hard mask) to form a first patterned graphene layer GNM11. Here, an oxygen ($O_2$) plasma etching method may be used for the etching of the first graphene layer GP11, for example. In this operation, the patterned polymer layer P11' (refer to FIG. 9C) may be removed.

Next, the buffer layer B11' may be removed. In order to remove the buffer layer B11, an acid solution, such as a hydrogen fluoride (HF) solution, may be used. A result of removing the buffer layer B11' from a structure of FIG. 9D is shown in FIG. 9E. Referring to FIG. 9E, the first patterned graphene layer GNM11 is disposed on the first substrate SUB11. Such a first patterned graphene layer GNM11 may have a structure that is the same as (or similar) to the graphene nanomesh GNM1 or GNM2 of FIG. 2 or 3. As shown in FIGS. 9A through 9E, when the first graphene layer GP11 is patterned by using the polymer layer P11' that is capable of self-assembly, the first patterned graphene layer GNM11 having a minute pattern may be formed. However, using of the polymer layer P11' is only an example, and the first graphene layer GP11 may be patterned by using other methods. For example, the first graphene layer GP11 may be patterned by using an electron beam lithography method, or the like.

Referring to FIGS. 9F and 9G, a second substrate SUB22 may be adhered to the first patterned graphene layer GNM11. The second substrate SUB22 may be a flexible substrate. For example, the second substrate SUB22 may be formed of plastic, such as polydimethylsiloxane (PDMS) or polyethylenenaphthalate (PEN). Such a second substrate SUB22 may be adhered to the first patterned graphene layer GNM11. However, the second substrate SUB22 is not limited to the flexible substrate. In other words, the second substrate SUB22 may not be flexible. The second substrate SUB22 may be a rigid substrate. Also, other methods may be used to adhere the second substrate SUB22 to the first patterned graphene layer GNM11 in FIGS. 9F and 9G. For example, a roll-to-roll method or the like may be used to adhere the second substrate SUB22 to the first patterned graphene layer GP11. If the roll-to-roll method is used, a large area process may be possible and productivity may be increased.

Next, the first substrate SUB11 may be removed from a structure shown in FIG. 9G. For example, if the first substrate SUB11 is a film or foil formed of a metal, such as copper (Cu) or nickel (Ni), the first substrate SUB11 may be removed by using a suitable etchant. A result of removing the first substrate SUB11 from the structure of FIG. 9G is shown in FIG. 9H. FIG. 9I shows a structure obtained by turning a structure of FIG. 9H upside down. Referring to FIG. 9I, the first patterned graphene layer GNM11 is disposed on the second substrate SUB22.

Through processes of FIGS. 9F through 9I, the first patterned graphene layer GNM11 may be transferred from the first substrate SUB11 to the second substrate SUB22. In other words, the first patterned graphene layer GNM11 of FIG. 9I may be formed on the second substrate SUB22 via a transfer method. The second substrate SUB22 does not go under a high temperature process if the transfer method is used, and thus other materials, such as flexible plastic, may be used for the second substrate SUB22. Also, a large area process may be possible and productivity may be increased by using the transfer method. Accordingly, a large area and flexible device may be easily manufactured with a low price.

Referring to FIG. 9J, a first insulation layer IN11 may be formed on the first patterned graphene layer GNM11. The first insulation layer IN11 may be formed of an organic insulation material or an inorganic insulation material. Examples of the inorganic insulation material include a silicon oxide, a silicon nitride, and an aluminum oxide.

Referring to FIG. 9K, a second patterned graphene layer GNM22 may be formed on a third substrate SUB33. A method of forming the second patterned graphene layer GNM22 on the third substrate SUB33 may be the same as (or similar) to the method forming the first patterned graphene layer GNM11 on the first substrate SUB11 (FIGS. 9A through 9E).

Referring to FIG. 9L, the second substrate SUB22 of FIG. 9J may be adhered to the third substrate SUB33. Here, the first insulation layer IN11 of the second substrate SUB22 may be adhered to the second patterned graphene layer GNM22 of the third substrate SUB33.

Next, the third substrate SUB33 may be removed from a structure shown in FIG. 9L, and the second substrate SUB22 may be turned upside down as shown in FIG. 9M. Referring to FIG. 9M, the first patterned graphene layer GNM11, the first insulation layer IN11, and the second patterned graphene layer GNM22 may be sequentially disposed on the second substrate SUB22.

Referring to FIG. 9N, a second insulation layer IN22 may be formed on the second patterned graphene layer GNM22. Like the first insulation layer IN11, the second insulation layer IN22 may be formed of an organic insulation material or an inorganic insulation material.

Referring to FIG. 9O, a third patterned graphene layer GNM33, a third insulation layer IN33, and a fourth patterned graphene layer GNM44 may be sequentially formed on the second insulation layer IN22. A method of forming the third patterned graphene layer GNM33, the third insulation layer IN33, and the fourth patterned graphene layer GNM44 may be the same as (or similar) to the method of forming the first patterned graphene layer GNM11, the first insulation layer IN11, and the second patterned graphene layer GNM22 on the second substrate SUB22. Hereinafter, a stacked structure of the first patterned graphene layer GNM11, the first insulation layer IN11, the second patterned graphene layer GNM22, the second insulation layer IN22, the third patterned graphene layer GNM33, the third insulation layer IN33, and the fourth patterned graphene layer GNM44 disposed on the second substrate SUB22 will be referred to as a multi graphene/insulator stack MGS1.

Referring to FIG. 9P, the multi graphene/insulator stack MGS1 may be etched in a desired (or alternatively predetermined) shape. The etched multi graphene/insulator stack MGS1' that is etched may include a channel-to-be region C11 including etched first to third insulation layers (IN11', IN22', IN33'), and first to four etched patterned graphene layers (GNM11', GNM22', GNM33', and GNM44').

Referring to FIG. 9Q, a source electrode S11 and a drain electrode D11 contacting each end of the channel-to-be region C11 may be formed. The source electrode S11 and the drain electrode D11 may be formed of any one of various metals, a transparent conductive oxide, such as indium tin oxide (ITO) or indium zinc oxide (IZO), or another material, such as graphene. By forming the source and drain electrodes S11 and D11, the channel-to-be region C11 may be defined as a channel region C11. A gate insulation layer GI11 may be formed on the channel region C11. The gate insulation layer GI11 may be formed to cover not only the channel region C11, but also the source and drain electrodes S11 and D11. The gate insulation layer GI11 may be formed of a silicon oxide, a silicon oxynitride, or a silicon nitride, or other materials, such as an organic insulation material or a high dielectric material having a dielectric constant higher than that of the silicon nitride. Also, the gate insulation layer GI11 may have a single or multi-layer structure. Next, a gate G11 may be formed on the gate insulation layer GI11. Like the source and drain electrodes S11 through D11, the gate G11 may be formed of any one of various metals, a transparent conductive oxide, or another material, such as graphene.

The method described with reference to FIGS. 9A through 9Q is only an example, and may vary. For example, a second gate and a second gate insulation layer may be first formed on the second substrate SUB22 of FIG. 9F, the second substrate SUB22 may be adhered to the first substrate SUB11, and then the processes of FIGS. 9G through 9Q may be performed. In this case, a semiconductor device (transistor) having the structure of FIG. 8 may be manufactured. The method may be further modified in various ways.

Figure 10A:
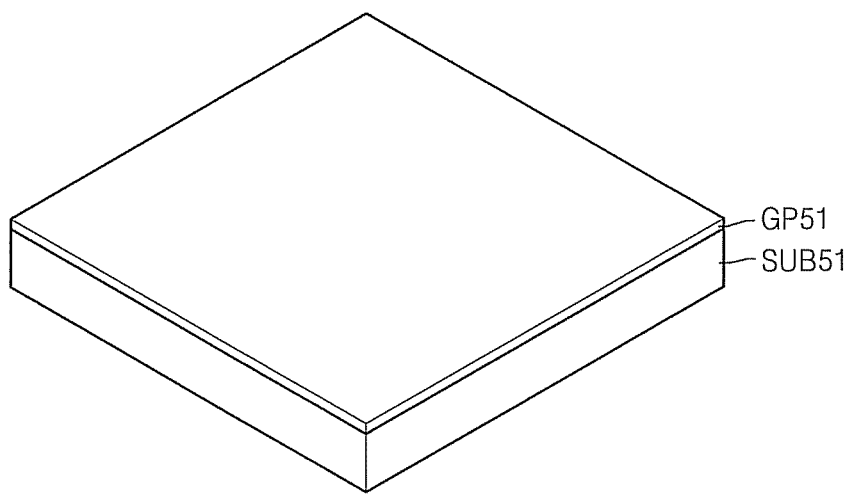
FIGS. 10A through 10F are views for describing a method of manufacturing a transistor, according to another example embodiment.
Figure 10B:
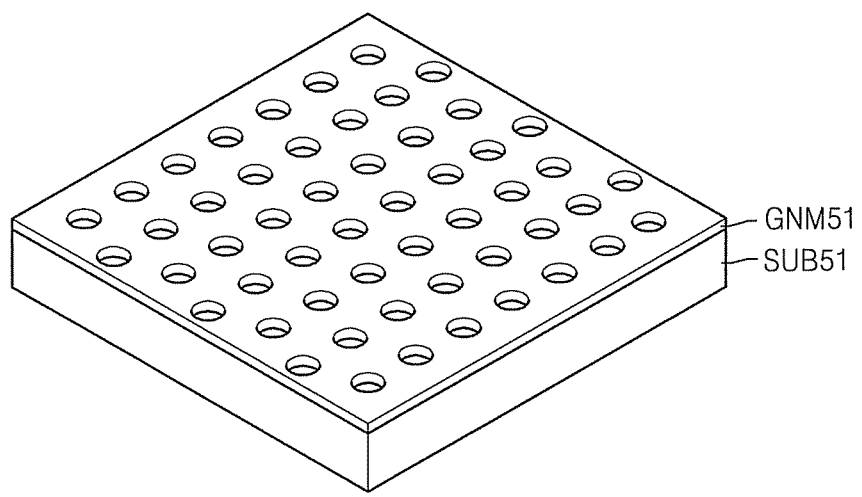
Figure 10C:
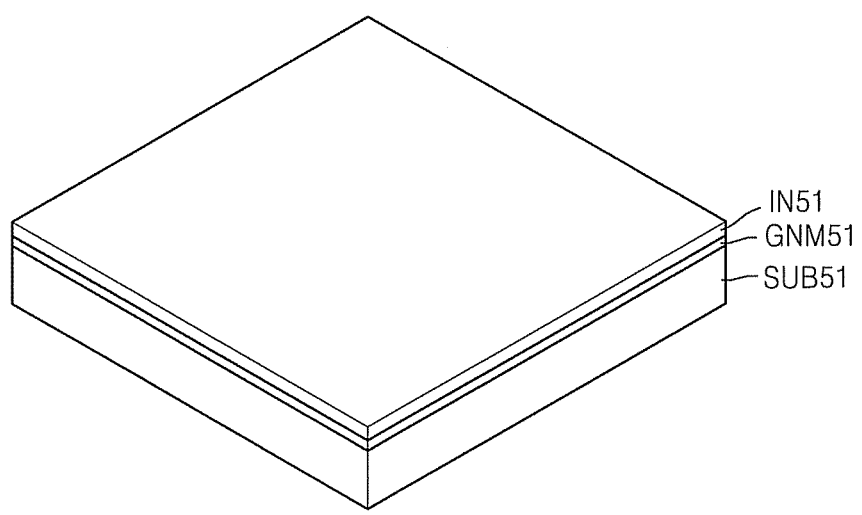
Figure 10D:
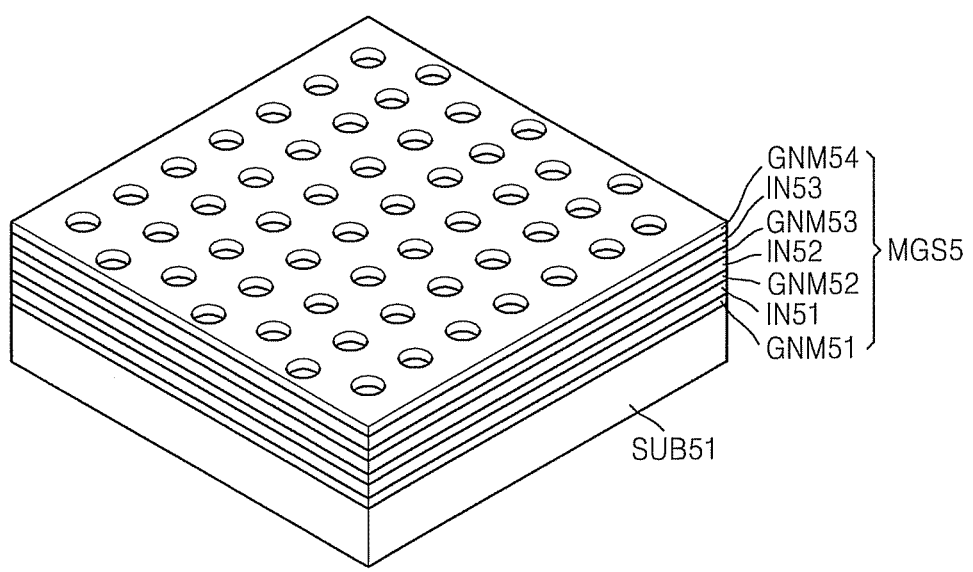
Figure 10E:
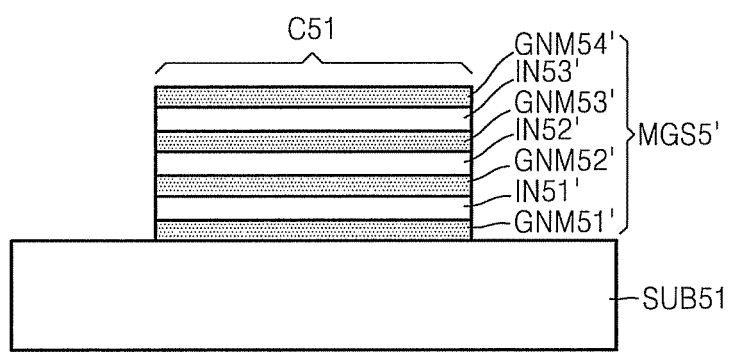
Figure 10F:
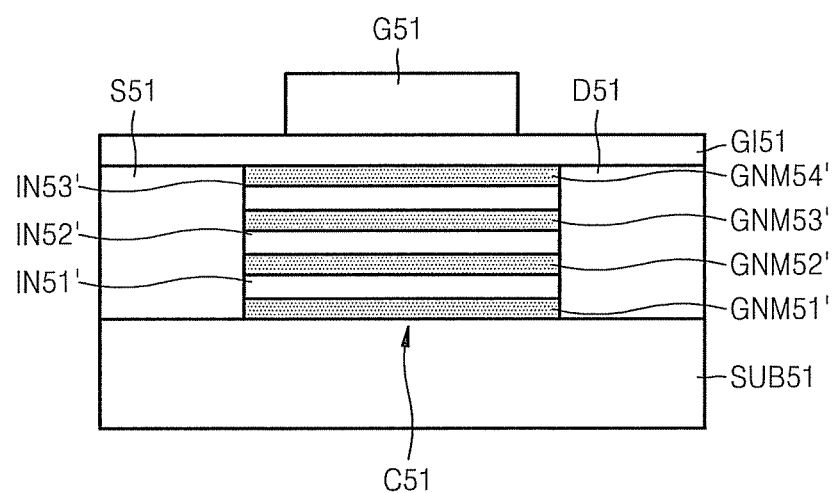

FIGS. 10A through 10F are views for describing a method of manufacturing a transistor (semiconductor device), according to another example embodiment. FIGS. 10A through 10D are perspective views, and FIGS. 10E and 10F are cross-sectional views.

Referring to FIG. 10A, a first graphene layer GP51 may be formed on a substrate SUB51. The first graphene layer GP51 may be a layer including one or more graphenes. The first graphene layer GP51 may be formed by using a CVD method or a transfer method.

Referring to FIG. 10B, the first graphene layer GP51 may be patterned to form a first patterned graphene layer GNM51. Any suitable patterning method may be used to pattern the first graphene layer GP51. For example, the method described with reference to FIGS. 9A through 9E may be used to pattern the first graphene layer GP51. Alternatively, the first graphene layer GP51 may be patterned by using an electron beam lithography method, or the like. Such a patterned first graphene layer GNM51 may have a structure that is the same as (or similar) to the graphene nanomesh GNM1 or GNM2 of FIG. 2 or 3. The first patterned graphene layer GNM51 may correspond to a first unit layer L1 of FIG. 1. Here, the first patterned graphene layer GNM51 has a nanomesh structure, but a pattern shape of the first patterned graphene layer GNM51 may differ. For example, the first patterned graphene layer GNM51 may have the structure of the graphene nanoribbon GNR1 of FIG. 4. Also in FIGS. 10A and 10B, the first graphene layer GP51 having a sheet type is formed on the substrate SUB51 and then patterned, but alternatively, a pre-patterned graphene layer may be transferred to the substrate SUB51.

Referring to FIG. 10C, a first insulation layer IN51 may be formed on the first patterned graphene layer GNM51. The first insulation layer IN51 may be formed of an inorganic insulation material, such as a silicon oxide, a silicon nitride, or an aluminum oxide, or an organic insulation material.

Referring to FIG. 10D, a second patterned graphene layer GNM52, a second insulation layer IN52, a third patterned graphene layer GNM53, a third insulation layer IN53, and a fourth patterned graphene layer GNM54 may be sequentially formed on the first insulation layer IN51. The first patterned graphene layer GNM51, the first insulation layer IN51, the second patterned graphene layer GNM52, the second insulation layer IN52, the third patterned graphene layer GNM53, the third insulation layer IN53, and the fourth patterned graphene layer GNM54 disposed on the substrate SUB51 may form a multi graphene/insulator stack MGS5.

Referring to FIG. 10E, the multi graphene/insulator stack MGS5 may be etched in a desired (or alternatively predetermined) shape. The etched multi graphene/insulator stack MGS5' may include a channel-to-be region C51 including etched first to third insulation layers (IN51', IN52', IN53'), and first to four etched patterned graphene layers (GNM51', GNM52', GNM53', and GNM54').

Referring to FIG. 10F, a source electrode S51 and a drain electrode D51 contacting each end of the channel-to-be region C51 may be formed. The source electrode S51 and the drain electrode D51 may be formed of any one of various metals, a transparent conductive oxide, or another material, such as graphene. By forming the source and drain electrodes S51 and D51, the channel-to-be region C51 may be defined as a channel region C51. A gate insulation layer GI51 may be formed on the channel region C51. The gate insulation layer GI51 may be formed to cover not only the channel region C51, but also the source and drain electrodes S51 and D51. The gate insulation layer GI51 may be formed of a silicon oxide, a silicon oxynitride, or a silicon nitride, or other materials, such as an organic insulation material or a high dielectric material having a dielectric constant higher than that of the silicon nitride. Also, the gate insulation layer GI51 may have a single or multi-layer structure. Next, a gate G51 may be formed on the gate insulation layer GI51. Like the source and drain electrodes S51 through D51, the gate G51 may be formed of any one of various metals, a transparent conductive oxide, or another material, such as graphene.

The method described with reference to FIGS. 10A through 10F is only an example, and may vary. For example, a second gate and a second gate insulation layer may be formed on the substrate SUB51 before forming the first graphene layer GP51, the first graphene layer GP51 may be formed on the second gate insulation layer, and then the processes of FIGS. 10B through 10F may be performed. In this case, a semiconductor device (transistor) having the structure of FIG. 8 may be manufactured. Also, each of the source and drain electrodes S51 and D51 may be formed through several operations, instead of a single operation. In detail, the first patterned graphene layer GNM51 in FIG. 10B may be etched in a first shape, and then a first portion of a source electrode and a first portion of a drain electrode, which contact the first patterned graphene layer GNM51, may be formed. Then, the second patterned graphene layer GNM52 may be patterned in the first shape, and a second portion of the source electrode and a second portion of the drain electrode, which contact the second patterned graphene layer GNM52, may be formed in FIG. 10D. Similarly, the third patterned graphene layer GNM53 may be etched in the first shape, third portions of the source and drain electrodes, which contact the third patterned graphene layer GNM53, may be formed, the fourth patterned graphene layer GNM54 may be etched in the first shape, and fourth portions of the source and drain electrodes, which contact the fourth patterned graphene layer GNM54, may be formed. Here, the first through fourth portions of the source electrode may be connected to (contact) each other to form one source electrode, and the first through fourth portions of the drain electrode may be connected to (contact) each other to form one drain electrode. The method of FIGS. 10A through 10F may be further modified in various ways.

Figure 11:
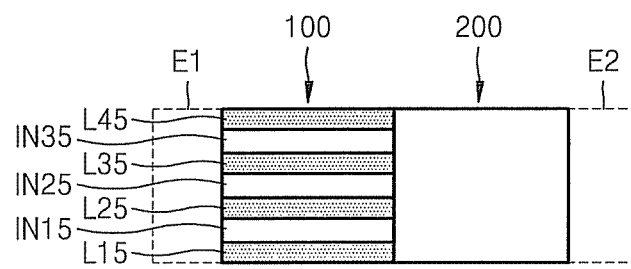
FIG. 11 is a cross-sectional view of a diode according to an example embodiment.

FIG. 11 is a cross-sectional view of a diode (semiconductor device) according to an example embodiment. The diode is a PN diode.

Referring to FIG. 11, a first layer 100 and a second layer 200 may be combined with each other. The first layer 100 may have a similar (or same) multi-layer structure as the channel layer C1 of FIG. 1. In other words, the first layer 100 may have a plurality of unit layers L15 through L45 spaced apart from each other in a vertical direction, i.e., in a Z-axis direction, wherein each of the unit layers L15 through L45 may include a patterned graphene layer. The patterned graphene layer may be the same as (or similar) to the graphene nanomesh GNM1 or GNM2 of FIG. 2 or 3, or the graphene nanoribbon GNR1 of FIG. 4. Since a structure of the first layer 100 is the same as (or similar) to that of the channel layer C1 of FIG. 1, details thereof will not be repeated. The second layer 200 combined to the first layer 100 may be a semiconductor. The second layer 200 may be the semiconductor having a conductive type different from the unit layers L15 through L45 of the first layer 100. For example, the unit layers L15 through L45 of the first layer 100 may be a P-type semiconductor, and the second layer 200 may be an N-type semiconductor. For example, the second layer 200 may be formed of an oxide-based inorganic semiconductor material, such as a zinc oxide (ZnO), a gallium-indium-zinc oxide (GaInZnO), or a hafnium-indium-zinc oxide (HfInZnO), a non-oxide-based inorganic semiconductor material, such as amorphous silicon (a-Si), or an organic semiconductor material. A first electrode E1 and a second electrode E2 configured to apply a voltage to the PN diode including the first and second layers 100 and 200 may be further provided. The first and second layers 100 and 200 may be connected in series between the first and second electrodes E1 and E2.

Figure 12:
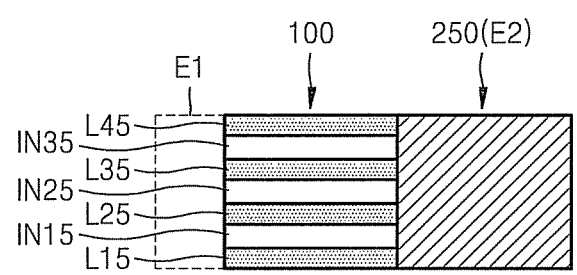
FIG. 12 is a cross-sectional view of a diode according to another example embodiment.

FIG. 12 is a cross-sectional view of a diode (semiconductor device) according to another example embodiment. The diode is a Schottky diode.

Referring to FIG. 12, the Schottky diode may have a structure in which a first layer 100 and a second layer 250 are combined to each other. Since the first layer 100 of FIG. 12 may have a similar (or the same) multi-layer structure as the first layer 100 of FIG. 11, details thereof will not be repeated. The second layer 250 may be a metal layer forming a Schottky junction with unit layers L15 through L45 of the first layer 100. Accordingly, the first and second layers 100 and 250 may form the Schottky diode. The Schottky diode may further include a first electrode E1 contacting the first layer 100. Since the second layer 250 is a metal layer, the second layer 250 itself may be used as a second electrode E2. The first layer 100 may be disposed between the first and second electrodes E1 and E2.

The first layer 100 of the diodes of FIGS. 11 and 12 may be formed using the same (or a similar) method used to manufacture the etched multi graphene/insulator stack MGS1' and MGS5' described with reference to FIGS. 9A through 9Q and 10A through 10F. In detail, in the method of FIGS. 9A through 9Q, a stacked structure of the first through fourth patterned graphene layers GP11 through GP44, and the first through third insulation layers IN11 through IN33 therebetween may correspond to the first layer 100 of FIG. 11 or 12, and the drain electrode D11 of FIG. 9Q may correspond to the second layer 200 or 250 of FIG. 11 or 12. Accordingly, the diodes of FIGS. 11 and 12 may be easily manufactured by modifying the method of FIGS. 9A through 9Q. Also, in the method of FIGS. 10A through 10F, a stacked structure of the first through fourth patterned graphene layers GP51 through GP54, and the first through third insulation layers IN51 through IN53 therebetween may correspond to the first layer 100 of FIG. 11 or 12, and the drain electrode D51 of FIG. 10F may correspond to the second layer 200 or 250 of FIG. 11 or 12. Accordingly, the diodes of FIGS. 11 and 12 may be easily manufactured by modifying the method of FIGS. 10A through 10F.

The diode according to an example embodiment may be used in various electronic devices. For example, the diode may be used in a photoelectric device, such as a solar cell. Here, the diode may be used as a photoelectric conversion element of the solar cell. Since the use of the diode as the photoelectric conversion element of the solar cell is well known and a general structure of the solar cell is well known, details about the solar cell will be omitted herein. The diode may be used in photoelectric devices other than the solar cell, such as a photo detector and a photo sensor, and in electronic devices other than the photoelectric devices.

It should be understood that example embodiments described herein should be considered in a descriptive sense only and not for purposes of limitation. Descriptions of features or aspects within each example embodiment may be available for other similar features or aspects in other example embodiments. For example, the transistors of FIGS. 1 and 8 and the diodes of FIGS. 11 and 12 may be variously modified. In detail, the unit layers L1 through L4 of the channel layer C1 may have a structure other than the nanomesh or nanoribbon, and may be formed of a material other than graphene. Also, the gate G1 may surround the channel layer C1, and the diode may be changed from a horizontal structure to a vertical structure. Further, the methods of FIGS. 9A through 9Q and 10A through 10F may be variously changed. Moreover, some example embodiments may be applied to a semiconductor device other than a transistor or a diode. Therefore, the scope of the inventive concepts is defined not by the detailed description of the inventive concepts but by the appended claims.

What is claimed is:

1. A semiconductor device comprising:
   a semiconductor element on a substrate including,
      a plurality of unit layers, the plurality of unit layers spaced apart from each other in a vertical direction with respect to a surface of the substrate and stacked in the vertical direction between the surface of the substrate and a gate electrode, the plurality of unit layers including first and second unit layers, each of the plurality of unit layers including a patterned graphene layer, the patterned graphene layer including one of a nanomesh structure and a nanoribbon structure, and
      an insulation layer between every two adjacent unit layers, the insulation layer including a first insulation single layer between the first and second unit layers, the first and second unit layers directly contacting lower and upper surfaces of the first insulation single layer, respectively, the first insulation single layer filling a substantially entire space between the first and second unit layers.

2. The semiconductor device of claim 1, wherein a width of a pattern of the patterned graphene layer is in the range from about 2 nm to about 10 nm.

3. The semiconductor device of claim 1, wherein the semiconductor device is a transistor, and the semiconductor element is a channel layer.

4. The semiconductor device of claim 3, wherein the transistor includes one of a single-gate and a double-gate structure.

5. The semiconductor device of claim 1, wherein the semiconductor device is a diode, the diode includes a first layer combined with a second layer, and the first layer includes the semiconductor element.

6. The semiconductor device of claim 5, wherein the second layer is a semiconductor layer.

7. The semiconductor device of claim 5, wherein the second layer is a metal layer.

8. An electronic device comprising the semiconductor device of claim 1.

9. The electronic device of claim 8, wherein the electronic device is one of a display device and a photoelectronic device.

10. The electronic device of claim 8, wherein the semiconductor device is included in one of a switching device, a driving device, and a sensing device.

11. A method of manufacturing a semiconductor device, comprising:
    forming a semiconductor element on an underlying substrate by,
       forming a plurality of unit layers, the plurality of unit layers spaced apart from each other in a vertical direction with respect to a surface of the underlying substrate and stacked in the vertical direction between the surface of the underlying substrate and a gate electrode, the plurality of unit layers including first and second unit layers, each of the plurality of unit layers including a patterned graphene layer, the patterned graphene layer including one of a nanomesh structure and a nanoribbon structure, and
       forming an insulation layer between every two adjacent unit layers, the insulation layer including a first insulation single layer between the first and second unit layers, the first and second unit layers directly contacting lower and upper surfaces of the first insulation single layer, respectively, the first insulation single layer filling a substantially entire space between the first and second unit layers.

12. The method of claim 11, wherein the forming of the semiconductor element comprises:
    forming a first patterned graphene layer on a first substrate;
    transferring the first patterned graphene layer from the first substrate to the underlying substrate;
    forming a first insulation layer on the first patterned graphene layer; and
    forming a second patterned graphene layer on the first insulation layer.

13. The method of claim 12, wherein the forming a second patterned graphene layer on the first insulation layer comprises:
    preparing the second patterned graphene layer on a third substrate, and
    transferring the second pattern graphene layer on the first insulation layer after the preparing the second patterned graphene layer.

14. The method of claim 12, further comprising:
    forming a second insulation layer on the second patterned graphene layer; and
    forming a third patterned graphene layer on the second insulation layer.

15. The method of claim 12, wherein the underlying substrate includes a flexible substrate.

16. The method of claim 11, wherein the forming of the semiconductor element comprises:
    forming a first patterned graphene layer on a first substrate;
    forming a first insulation layer on the first patterned graphene layer; and
    forming a second patterned graphene layer on the first insulation layer.

17. The method of claim 16, further comprising:
    forming a second insulation layer on the second patterned graphene layer; and
    forming a third patterned graphene layer on the second insulation layer.

18. The method of claim 11, wherein the patterned graphene layer includes one of a nanomesh and a nanoribbon structure.

19. The method of claim 11, further comprising:
forming a source contacting a first region of the semiconductor element;
forming a drain contacting a second region of the semiconductor element; and
forming a gate configured to apply an electric field to the semiconductor element.

20. The method of claim 11, wherein
the semiconductor element is a first layer, and
the method further includes forming a second layer contacting the semiconductor element,
the second layer being one of a semiconductor layer and a metal layer.

21. The semiconductor device of claim 1, wherein the first and second unit layers have a same width as the first insulation single layer.

* * * * *